United States Patent
Asano et al.

(10) Patent No.: US 11,621,710 B2
(45) Date of Patent: Apr. 4, 2023

(54) CAPACITANCE SWITCH

(71) Applicant: TOPRE CORPORATION, Tokyo (JP)

(72) Inventors: Mamoru Asano, Kanagawa (JP); Daiki Mitsumori, Kanagawa (JP)

(73) Assignee: TOPRE CORPORATION, Tokyo (JP)

( * ) Notice: Subject to any disclaimer, the term of this patent is extended or adjusted under 35 U.S.C. 154(b) by 302 days.

(21) Appl. No.: 17/003,897

(22) Filed: Aug. 26, 2020

(65) Prior Publication Data
US 2021/0159900 A1 May 27, 2021

(30) Foreign Application Priority Data
Nov. 22, 2019 (JP) .............................. JP2019-210973

(51) Int. Cl.
*H03K 17/975* (2006.01)
*G06F 3/044* (2006.01)
*G01R 27/26* (2006.01)

(52) U.S. Cl.
CPC ....... *H03K 17/975* (2013.01); *G01R 27/2605* (2013.01); *G06F 3/044* (2013.01)

(58) Field of Classification Search
CPC .... H03K 17/975; G06F 3/044; G01R 27/2605
USPC ...................................... 200/600; 235/145 R
See application file for complete search history.

(56) References Cited

U.S. PATENT DOCUMENTS

| | | | | |
|---|---|---|---|---|
| RE30,435 E | * | 11/1980 | Fukao ....................... | B41J 5/16 235/145 R |
| 4,408,252 A | * | 10/1983 | Voge ..................... | H03K 17/975 200/600 |
| 4,584,444 A | * | 4/1986 | Nagashima .......... | H03K 17/975 200/600 |
| 4,736,076 A | * | 4/1988 | Mochizuki ........... | H01H 13/702 200/600 |
| 2006/0056132 A1 | * | 3/2006 | Yoshida ................... | H01G 5/16 361/294 |
| 2015/0090579 A1 | * | 4/2015 | Kurikawa ............ | H03K 17/962 200/600 |

FOREIGN PATENT DOCUMENTS

JP 2011-175839 A 9/2011

* cited by examiner

*Primary Examiner* — Prabodh M Dharia
(74) *Attorney, Agent, or Firm* — Kilpatrick Townsend & Stockton LLP

(57) ABSTRACT

A capacitance switch includes an electrode portion having a first electrode and a second electrode, a moving member, and a pressing member having a projecting portion. A distance between the moving member and the electrode portion is changed by displacing the projecting portion. The moving member has a first moving surface and a second moving surface. The projecting portion includes a first projecting portion and a second projecting portion. The first projecting portion is to be displaced by first pressing of the pressing member and brings the first moving surface close to the electrode portion. The second projecting portion is to be displaced by second pressing larger than the first pressing and brings the second moving surface close to the electrode portion.

5 Claims, 5 Drawing Sheets

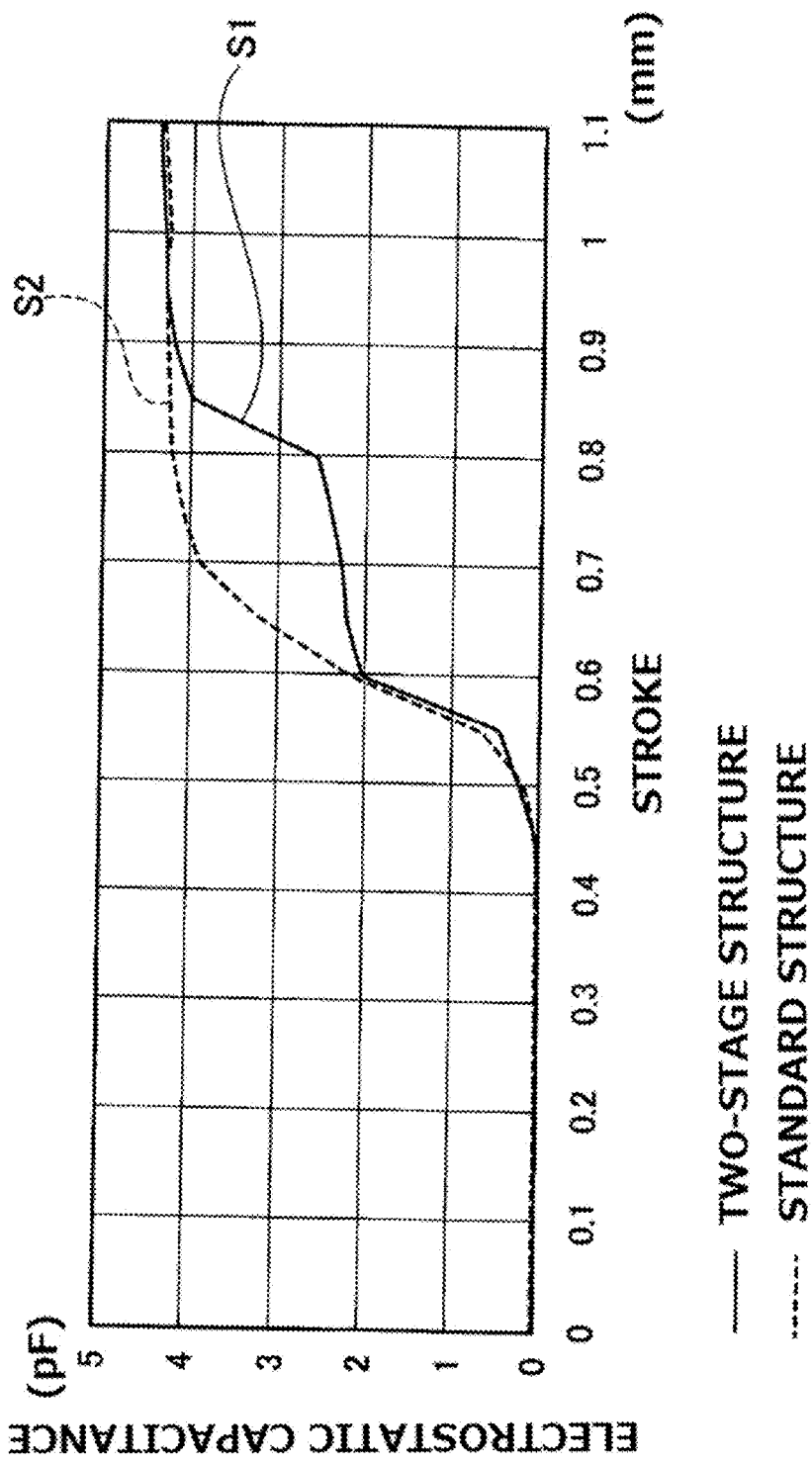

CAPACITANCE SWITCH

CROSS-REFERENCE TO RELATED APPLICATIONS

This application is based on and claims priority from Japanese Patent Application No. 2019-210973 filed on Nov. 22, 2019, the contents of which are incorporated herein by reference.

TECHNICAL FIELD

The present disclosure relates to a switch used in an input device or the like that inputs information to electronic equipment, and also relates to a capacitance switch using an electrostatic capacitance as an input way.

BACKGROUND ART

For example, in an autofocus shutter or the like of a camera, a two-stage switch where two-stage input is possible with one structure is used. As an operation method of the two-stage switch, various methods such as a mechanical method, a capacitance system, and a mechanical/capacitance double method are known. Among them, a capacitance type switch using a change in electrostatic capacitance is often used because of excellent durability without a mechanical contact, simplification of a circuit or structure, and good operational feeling.

JP2011175839A discloses a switch in which two-stage input is possible using that the electrostatic capacitance further increases by a change in electrostatic capacitance between a finger touching a keypad and a conductive pattern on a substrate and by an increase in a contact area of the keypad by operation of fully depressing the keypad.

The capacitance switch disclosed in JP2011175839A has a configuration in which a finger of an operator is used as one electrode. Thus, even if an interval between the finger and the electrode is the same, since a capacitance value varies due to a change in a touch area of the finger (a thickness of the finger) or human body capacitance, a big difference occurs in the detected capacitance value depending on a way of touching. Accordingly, a change in a stroke and the electrostatic capacitance value of the switch varies with an input environment.

In addition, noise removal or a stray capacitance countermeasure on the human body may be difficult and a stable capacitance value may not be available. Thus, it is difficult to obtain a sharp capacitance change at two places. Further, there may be variation between individual switches, and it is not suitable for use in an input device such as a game mouse that requires fast operation or a keyboard that requires continuous hits.

SUMMARY

In accordance with an aspect of the present disclosure, a capacitance switch has high-speed responsiveness and is capable of stable two-stage input in one stroke.

In accordance with an aspect of the present disclosure, a capacitance switch includes an electrode portion, a moving member, and a pressing member. The electrode portion includes a first electrode and a second electrode electrically insulated from the first electrode. The moving member is formed of an electric conductor or a dielectric. The pressing member has a projecting portion. The pressing member is configured to change a distance between the moving member and the electrode portion by displacing the projecting portion. The moving member has a first moving surface and a second moving surface that moves independently of the first moving surface. The projecting portion includes a first projecting portion and a second projecting portion. The first projecting portion is to be displaced by first pressing of the pressing member and brings the first moving surface close to the electrode portion. The second projecting portion is to be displaced by second pressing larger than the first pressing and brings the second moving surface close to the electrode portion.

BRIEF DESCRIPTION OF DRAWINGS

FIG. 9 is a graph showing a change in a stroke and electrostatic capacitance when the capacitance switch has a one-stage structure and when the capacitance switch has a two-stage structure.

DESCRIPTION OF EMBODIMENTS

Figure 1:
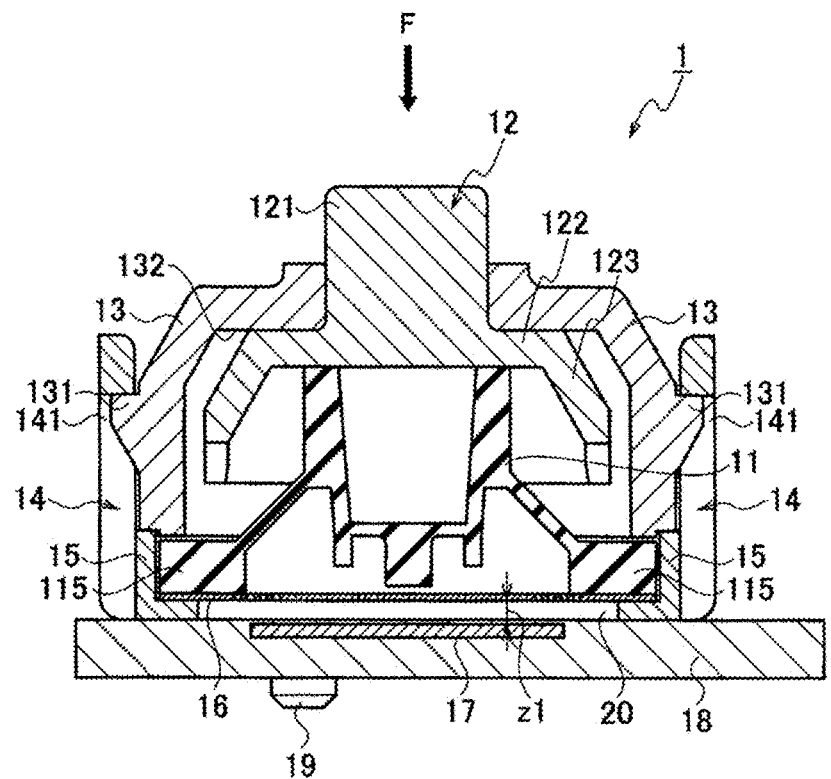
FIG. 1 is a sectional view showing a configuration of a capacitance switch according to an embodiment, and shows a state in which the switch is not operated.

A capacitance switch according to an embodiment will be described below with reference to the drawings. FIG. 1 is a sectional view showing a configuration of a capacitance switch (hereinafter simply abbreviated as "switch") according to an embodiment.

As shown in FIG. 1, the switch 1 includes a rubber member 11 (pressing member), a plunger 12, an upper housing 13, a lower housing 14, a movable electrode 16, a fixed electrode 17, and a substrate 18. The lower housing 14 is provided with a spacer 15. A sign 19 denotes a boss for fixing the lower housing 14 to the substrate 18.

Figure 2:
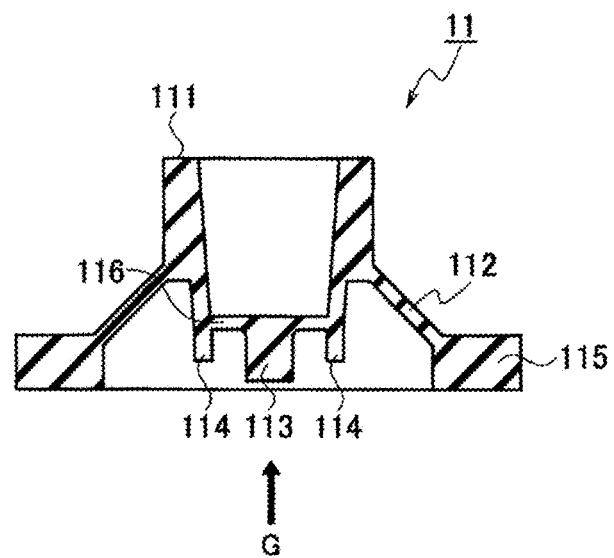
FIG. 2 is a sectional view of a rubber member used in the capacitance switch according to the embodiment.
Figure 3:
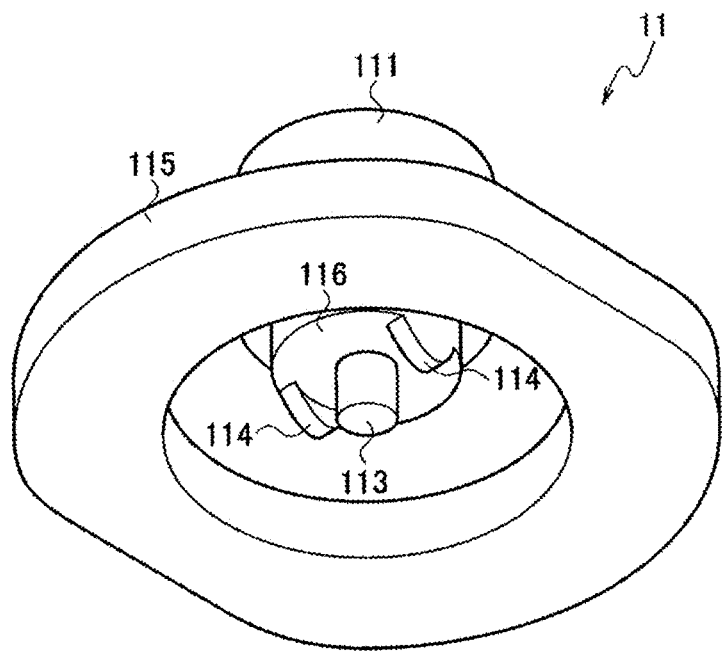
FIG. 3 is a perspective view viewed below of the rubber member used in the capacitance switch according to the embodiment.

FIG. 2 is a sectional view of the rubber member 11, and FIG. 3 is a perspective view of the rubber member 11 viewed below. The rubber member 11 is made of a material having flexibility and insulating properties. The rubber member 11 is made of silicone rubber, urethane rubber, or the like.

As shown in FIG. 2, the rubber member 11 has a hollow cylindrical pressing portion 111 and a columnar central projecting portion 113 (first projecting portion) formed in an approximately central portion of a lower end surface 116 of the pressing portion 111. The rubber member 11 includes peripheral projecting portions 114 (second projecting portions) formed at two places around the lower end surface 116. The two peripheral projecting portions 114 are provided at places facing each other, namely a position of 180° sandwiching the central projecting portion 113.

A lower end of the central projecting portion 113 projects slightly below lower ends of the peripheral projecting portions 114. Therefore, when the pressing portion 111 is pressed and a support leg portion 112 to be described later is elastically deformed, the lower end of the central projecting portion 113 is in contact with the movable electrode 16 first, and then the lower ends of the peripheral projecting portions 114 become in contact with the movable electrode 16 by further elastic deformation of the support leg portion 112. In other words, when the pressing portion 111 is pressed to be first pressing, the central projecting portion 113 is in contact with the movable electrode 16 to move the movable electrode 16 downward. Further, when the pressing portion 111 is pressed to be second pressing larger than the first pressing, the peripheral projecting portions 114 come into contact with the movable electrode 16 to move the movable electrode 16 downward.

The rubber member 11 includes a rubber base 115 having an annular shape with a section in a rectangular shape and the support leg portion 112 (deformation member) provided between the pressing portion 111 and the rubber base 115 and having an upper cutting cone shape as a whole.

The rubber base 115 is positioned on a surface of a peripheral portion of the movable electrode 16 and supports the entire rubber member 11.

The rubber member 11 includes two projecting portions, namely the central projecting portion 113 (first projecting portion) and the peripheral projecting portions 114 (second projecting portions), and has a function as a pressing member that changes a distance between the movable electrode 16 (moving member) and the fixed electrode 17 (electrode portion) by displacing each projecting portion in a vertical direction.

The central projecting portion 113 (first projecting portion) is provided at the center of the rubber member 11 (pressing member) in a plan view (a plan view viewed from a direction of a sign G in FIG. 2), is separated from the movable electrode 16 (moving member) at a normal time when the rubber member 11 is not pressed, and is in contact with a first region P1 (first moving surface) by deforming the support leg portion 112 when the rubber member 11 is pressed in a first stage (at the time of first pressing).

Further, the peripheral projecting portions 114 (second projecting portions) are provided at positions away from the center projecting portion 113 of the rubber member 11 in the plan view, are separated from the movable electrode 16 at the normal time, and are in contact with a second region P2 (second moving surface) by further deforming the support leg portion 112 when the rubber member 11 is pressed in a second stage (at the time of second pressing).

The support leg portion 112 has flexibility and is elastically deformed when the pressing portion 111 is pressed downward from the upper end side by operation of a user. Therefore, the pressing portion 111 moves downward, and the central projecting portion 113 and the peripheral projecting portions 114 move downward. When the pressing by the user is released, the support leg portion 112 returns to an original state by an elastic force.

Returning to FIG. 1, the plunger 12 is provided above the rubber member 11. The plunger 12 includes a cylindrical portion 121, a flat plate portion 122, and a leg portion 123. The plunger 12 is made of an insulating material such as plastic.

An operation switch such as a key top or a mouse button is provided on an upper portion of the plunger 12.

The cylindrical portion 121 has a cylindrical shape, and an upper surface thereof is a surface pressed from a direction of a sign "F" by the user. The flat plate portion 122 is formed substantially parallel to the substrate 18. A lower surface of the flat plate portion 122 is in contact with an upper surface of the pressing portion 111 (see FIG. 2) of the rubber member 11.

The leg portion 123 is formed obliquely downward from the periphery of the flat plate portion 122.

An upper housing 13 and a lower housing 14 for holding the plunger 12 are provided on the periphery of the plunger 12.

The lower housing 14 has a cylindrical shape, and a central axis of the cylinder is provided to be in a direction perpendicular to the substrate 18.

The upper housing 13 is disposed so as to surround the plunger 12. A projecting portion 131 is formed in the peripheral portion of the upper housing 13. A cut-out 141 is formed on an inner surface side of the lower housing 14. The projecting portion 131 engages with the cut-out 141, and the upper housing 13 is fixed to the lower housing 14.

In a normal state (a state in which no force is applied from the direction of the sign "F") in which the plunger 12 is not pressed, an upper back surface 132 of the upper housing 13 is in surface contact with the flat plate portion 122 of the plunger 12.

A spacer 15 formed in the lower housing 14 has an L-shaped section and is provided between an outer peripheral surface of the rubber base 115 of the rubber member 11 and the substrate 18.

The movable electrode 16 (moving member) has a flat plate shape and is disposed on the upper surface of the spacer 15 so as to be substantially parallel to the substrate 18. The rubber base 115 of the rubber member 11 is in contact with the peripheral portion of the movable electrode 16. Since the spacer 15 is formed in the lower housing 14, a space 20 is formed.

The substrate 18 is, for example, a rigid substrate. The fixed electrode 17 having a flat plate shape is formed on the substrate 18, and a resist is further formed on a surface thereof.

[Configurations of Movable Electrode 16 and Fixed Electrode 17]

Figure 4:
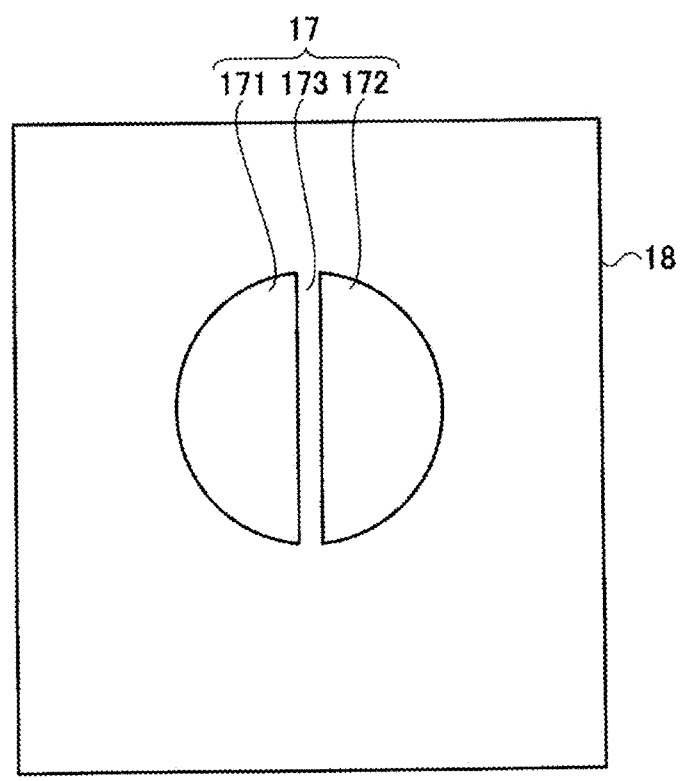
FIG. 4 is a plan view showing a configuration of a fixed electrode used in the capacitance switch according to the embodiment.
Figure 5:
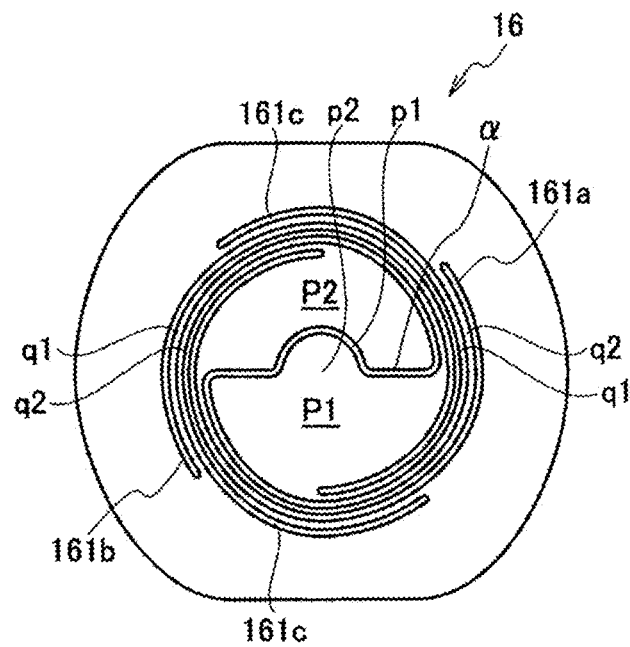
FIG. 5 is a plan view showing a configuration of a movable electrode used in the capacitance switch according to the embodiment.
Figure 6:
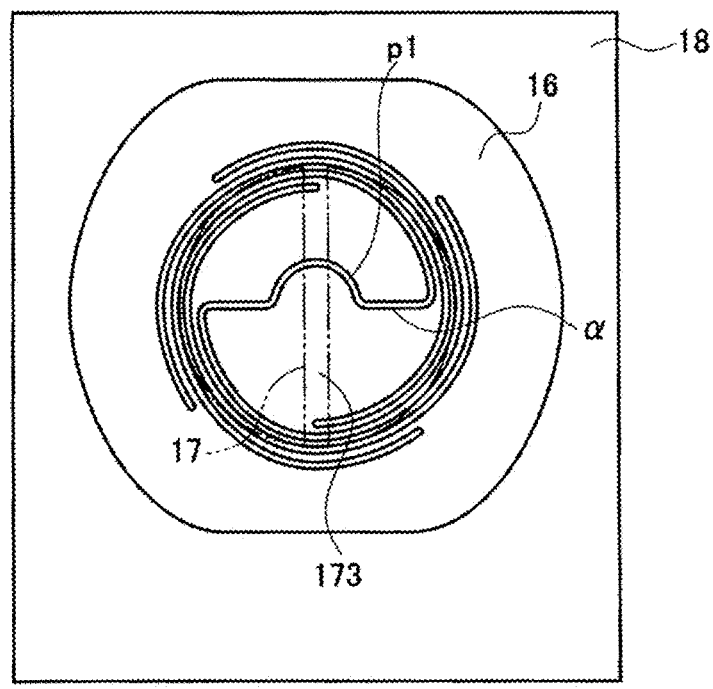
FIG. 6 is an explanatory view showing a state in which the movable electrode is disposed on the fixed electrode used in the capacitance switch according to the embodiment.

Next, detailed configurations of the movable electrode 16 and the fixed electrode 17 will be described with reference to FIG. 4 to FIG. 6. FIG. 4 is a plan view of the fixed electrode 17, FIG. 5 is a plan view of the movable electrode 16, and FIG. 6 is a plan view showing the fixed electrode 17 (indicated by a two-dot chain line) superimposed on the movable electrode 16.

As shown in FIG. 4, the fixed electrode 17 (electrode portion) formed on the insulating substrate 18 is made of a conductor such as copper foil, and has two electrodes having a semicircular shape, that is, a first electrode 171 and a second electrode 172. A region in which no electrode is formed between the electrodes 171 and 172 is defined as a space portion 173. That is, the first electrode 171 and the second electrode 172 are insulated by the space portion 173. The space portion 173 includes a resist.

Each of the first electrode 171 and the second electrode 172 is connected to a detection circuit (not shown) via an electric wire.

The fixed electrode 17 has a function as a capacitor. One of the electrodes 171 and 172 is a drive side fixed electrode, and the other is a sense side fixed electrode.

As shown in FIG. 5, the movable electrode 16 is formed of a metal plate such as stainless steel, and spiral cut-outs 161a, 161b, and 161c are formed by etching or the like. The cut-out 161a has an arc shape with a narrow width and is formed by an angle slightly smaller than 360° around a central portion of the movable electrode 16. Similarly, the cut-out 161b has an arc shape with a narrow width and is formed by an angle slightly smaller than 360° around a central portion of the movable electrode 16. The movable electrode 16 may be made of a dielectric other than metal. Although FIG. 5 shows an example in which the cut-outs 161a and 161b are formed by an angle slightly smaller than 360°, the present invention is not limited thereto, and may be larger than 360°.

The cut-out 161c is formed so as to pass through a region between the two cut-outs 161a and 161b and pass through the central portion of the movable electrode 16. The cut-out 161c forms a semicircular curve portion p1 at the central portion of the movable electrode 16. A region at the center of the movable electrode 16 is divided into two regions of a first region P1 (first moving surface) and a second region P2 (second moving surface) by the curve portion p1. Since the semicircular curve portion p1 is formed, a semicircular portion p2 is formed in the first region P1.

The shape of the curve portion p1 may not be semicircular, and may be any shape as long as the curve portion p1 is pressed by the central projecting portion 113 of the rubber member 11. For example, the semicircular portion p2 may have a quadrangular shape or a triangular shape.

Regions (signs q1 and q2) of the metal plate sandwiched by the cut-outs 161a to 161c are narrow curved regions. By forming the cut-outs 161a to 161c, the regions have a function of a spring for biased by a force applied in a direction (normal direction) orthogonal to the metal plate. Among the regions sandwiched by the cut-outs 161a to 161c, a region connected to the first region P1 is set as a spring portion q1 (first spring portion), and a region connected to the second region P2 is set as a spring portion q2 (second spring portion).

That is, the movable electrode 16 (moving member) has a planar shape and includes the spring portion q1 (first spring portion) that moves the first region P1 (first moving surface) toward the fixed electrode 17 by biasing by displacement of the central projecting portion 113 and the spring portion q2 (second spring portion) that moves the second region P2 (second moving surface) toward the fixed electrode 17 by biasing by displacement of the peripheral projecting portions 114.

The spring portion q1 and the spring portion q2 are spiral springs.

The cut-outs 161a to 161c are formed in, for example, an Archimedean spiral shape and a width of the cut-out is constant. Therefore, the spring portions q1 and q2 have a fixed width. The spring portions q1 and q2 have a small fluctuation range in a horizontal direction (direction parallel to the metal plate) with respect to fluctuation in the direction (normal direction) orthogonal to the metal plate, and thus durability is high. The movable electrode 16 has a function as a moving member formed of a conductor or a dielectric.

The cut-outs 161a to 161c do not necessarily need to have the same width and may thicken a starting point outside and gradually become narrow toward an end point or may narrow the starting point outside and gradually become thick toward the end point on the contrary. The first region P1 and the second region P2 may be movable in the vertical direction (a direction orthogonal to the paper surface of FIG. 5) by the spring portions q1 and q2. The cut-outs 161a to 161c can have various shapes and may be formed in, for example, an undulating shape with a constant width.

When the first region P1 is pressed in the normal direction (the direction orthogonal to the paper surface of FIG. 5) of the movable electrode 16 by forming the spring portion q1, the first region P1 moves in the normal direction, and the spring portion q1 is biased. That is, when the first region P1 is pressed in the normal direction (orthogonal direction), the spring portion q1 is biased, and when pressing is released, the first region P1 returns to an original position.

Similarly, when the second region P2 is pressed in the normal direction of the movable electrode 16, the second region P2 moves in the normal direction, the spring portion q2 is biased, and when pressing is released, the second region P2 returns to an original position. That is, the first region P1 and the second region P2 each independently move in the normal direction of the movable electrode 16.

The semicircular portion p2 formed in the first region P1 is a portion pressed by the central projecting portion 113 of the rubber member 11 shown in FIG. 2.

FIG. 6 shows the fixed electrode 17 superimposed on the movable electrode 16. As shown in FIG. 6, among the cut-out 161c, a region a crossing the central portion of the movable electrode 16 and a space portion 173 of the fixed electrode 17 are disposed to be orthogonal to each other.

[Description of Operation of the Present Embodiment]

Figure 7:
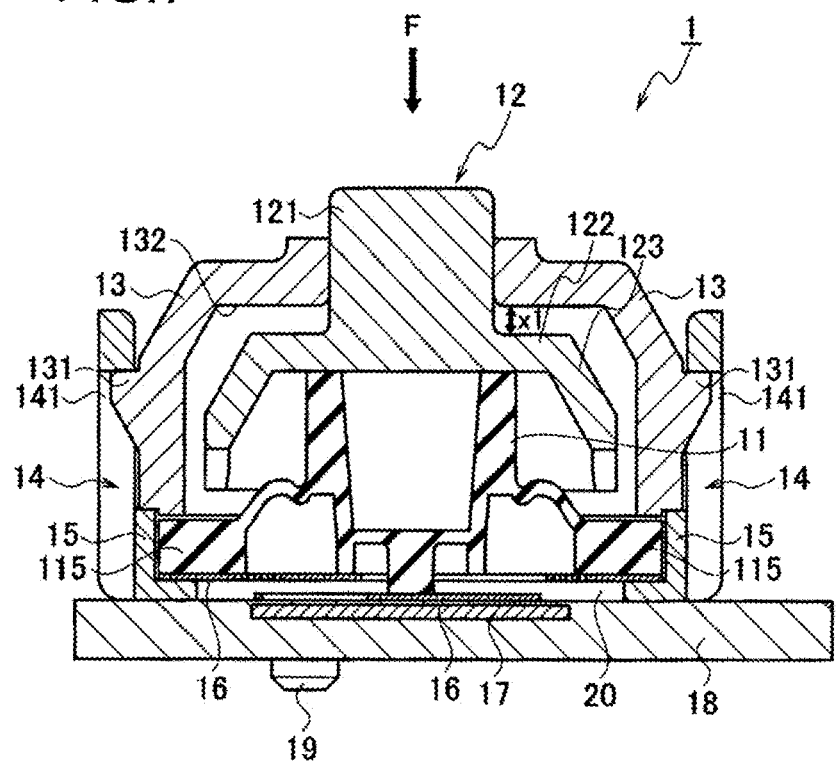
FIG. 7 is a sectional view showing a state when the capacitance switch according to the embodiment is operated until a first stage.
Figure 8:
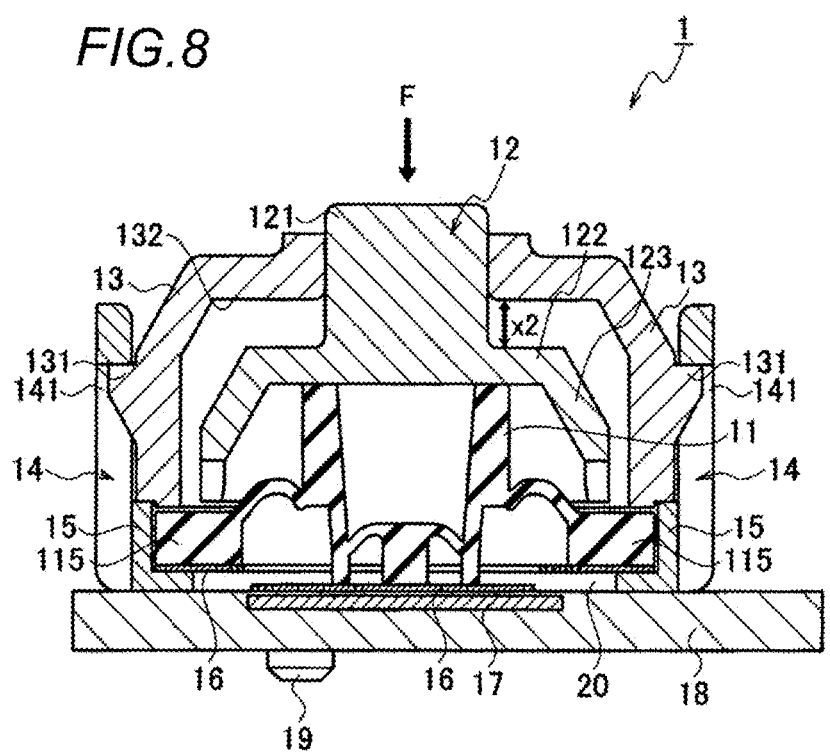
FIG. 8 is a sectional view showing a state when the capacitance switch according to the embodiment is operated until a second stage.

Next, operation of the switch 1 according to the present embodiment will be described. FIG. 7 is a sectional view showing a state (hereinafter referred to as a first pressing state) when the plunger 12 is pressed from a direction denoted by the sign "F" to be first pressing. FIG. 8 is a sectional view showing a state (hereinafter referred to as a second pressing state) when the plunger 12 is further pressed from the first pressing state to be second pressing larger the first pressing. In contrast to FIG. 7 and FIG. 8, the state shown in FIG. 1, namely a state in which the plunger 12 is not pressed, is referred to as a "normal state".

In the normal state shown in FIG. 1, since the plunger 12 is not pressed, the support leg portion 112 (see FIG. 2) is not elastically deformed. Therefore, the central projecting portion 113 is not in contact with the movable electrode 16, and there is a distance z1 (see FIG. 1) between the movable electrode 16 and the fixed electrode 17. That is, since the movable electrode 16 does not get close to the fixed electrode 17, electrostatic capacitance between the first electrode 171 and the second electrode 172 forming the fixed electrode 17 is first electrostatic capacitance (which is C1).

Next, when the user presses the plunger 12, as shown in FIG. 7, the pressing portion 111 of the rubber member 11 moves downward, the support leg portion 112 is elastically deformed, and the central projecting portion 113 moves downward. The central projecting portion 113 comes into contact with the semicircular portion p2 shown in FIG. 5, and presses the semicircular portion p2 and the first region P1 downward. The first region P1 moves downward and approaches the fixed electrode 17. That is the first pressing state. At this time, a distance between the flat plate portion 122 of the plunger 12 and the upper back surface 132 of the upper housing 13 is x1. Incidentally, "approach the fixed electrode 17" is a concept including contact with the fixed electrode 17 via a resist. Since the fixed electrode 17 is covered with a resist, even if the first region P1 or the second region P2 of the movable electrode 16 is in contact with the fixed electrode 17 via a resist, the first electrode 171 and the second electrode 172 are in an insulated state and do not form a short circuit.

In the first pressing state, since the first region P1 of the movable electrode 16 approaches between the first electrode 171 and the second electrode 172 of the fixed electrode 17, the electrostatic capacitance between the first electrode 171 and the second electrode 172 changes to second electrostatic capacitance (which is C2).

Further, since the spring portion q1 is formed in the movable electrode 16, the spring portion q1 is biased. That is, when the user releases pressing of the plunger 12 in this state, the movable electrode 16 returns to the original flat plate shape by a biasing force of the spring portion q1. Further, the rubber member 11 returns to the normal state (the state shown in FIG. 1) by a biasing force of the support leg portion 112.

On the other hand, when the plunger 12 is further pressed from the first pressing state shown in FIG. 7, the peripheral projecting portions 114 shown in FIG. 2 presses the second region P2 of the movable electrode 16 shown in FIG. 5 downward. As shown in FIG. 8, the second region P2 moves downward and approaches the fixed electrode 17. That is the second pressing state. At this time, a distance between the flat plate portion 122 of the plunger 12 and the upper back surface 132 of the upper housing 13 is x2.

In the second pressing state, since both the first region P1 and the second region P2 of the movable electrode 16 approaches between the first electrode 171 and the second electrode 172 of the fixed electrode 17, the electrostatic capacitance between the first electrode 171 and the second electrode 172 changes to third electrostatic capacitance (which is C3).

When pressing of the plunger 12 is released, the movable electrode 16 returns to an original flat plate shape by a biasing force of the spring portions q1 and q2. Further, the rubber member 11 returns to the normal state (the state shown in FIG. 1) by a biasing force of the support leg portion 112 and the lower end surface 116.

[Change in Stroke and Electrostatic Capacitance]

Next, a change in a stroke and electrostatic capacitance when the plunger 12 is pressed will be described with reference to a graph shown in FIG. 9.

A curve S1 (solid line) shown in FIG. 9 shows a case where the switch 1 has a two-stage structure (a case in the present embodiment), and a curve S2 (broken line) shows a case where the switch 1 has a structure (standard structure) that does not have a two-stage structure. In the curve S2, when the stroke of the plunger 12 reaches 0.5 [mm], the electrostatic capacitance starts to increase and reaches about 4.2 [pF] of an upper limit in the vicinity of 0.8 [mm]. That is, in the normal state, the electrostatic capacitance is set to 0 [pF], and the electrostatic capacitance changes to 4.2 [pF] in a pressed state of the plunger.

On the other hand, in the curve S1, when the stroke of the plunger 12 reaches 0.5 [mm], the electrostatic capacitance starts to increase, and the electrostatic capacitance is 2 [pF] to 2.5 [pF] in a range of 0.6 [mm] to 0.8 [mm]. Further, when the stroke reaches about 0.9 [mm], the electrostatic capacitance reaches 4.2 [pF]. That is, the electrostatic capacitance is set to 0 [pF] at a normal time, the electrostatic capacitance is set to 2 [pF] to 2.5 [pF] by one-stage pressing, and the electrostatic capacitance is set to 4.2 [pF] by two-stage pressing.

After that, even if the stroke is increased, only a state in which the resists of the movable electrode 16 and the fixed electrode 17 are in contact is maintained, so that the electrostatic capacitance does not change.

As described above, in the present embodiment, it is possible to function as a two-stage switch that is switched by the stroke of the plunger 12.

In this way, in the switch 1 (capacitance switch) according to the present embodiment, in a normal state in which the user does not press the plunger 12, the electrostatic capacitance between the first electrode 171 and the second electrode 172 becomes the first electrostatic capacitance C1. When the user presses the plunger 12 to enter the first pressing state, the electrostatic capacitance becomes the second electrostatic capacitance C2. Thereafter, when the user further presses the plunger 12 to enter the second pressing state, the electrostatic capacitance becomes the third electrostatic capacitance C3.

Then, by detecting the change in the electrostatic capacitance, a pressing state of the plunger 12 by the user can be detected. Therefore, the switch 1 can be switched in two stages and used.

In addition, since the support leg portion 112 provided in the rubber member 11 is elastically deformed, the rubber member 11 is a configuration that presses the movable electrode 16 and immediately returns to a normal state when pressing by the user is released, so that a switching speed of the switch can be increased.

Since the spring portions q1 and q2 are formed in the movable electrode 16 and the first region P1 and the second region P2 are brought close to the fixed electrode 17, responsiveness can be excellent and durability can be improved.

Further, an abrupt change in an analog signal (capacitance) can be produced at two places in a short stroke, and high-speed responsiveness of a switching operation can be realized by "two operations/one stroke", and continuous hit input can be made possible.

In addition, an ON position can be selected according to a position of the user's preference due to the abrupt change in the capacitance of the capacitor per stroke. In addition, a S/N ratio under fine electrostatic capacitance detection can be improved and the switching operation can be stabilized without being affected by noise on the human body as in the related art.

Further, since reliable input is possible with a weak force by an electrostatic capacitance method, it is possible to maintain optimum load characteristics even if there are two input points. Since the two-stage input switch has a simple structure, it can be manufactured at a lower price than other methods. In addition, it is possible to attempt reduction in thickness that cannot be achieved in a capacitance switch of a conical spring method in the related art.

Although the embodiment of the present invention has been described above, it should not be understood that the statement and drawings that form a part of the disclosure limit the invention. Various alternative embodiments, examples, and operational techniques will be apparent to those skilled in the art from the disclosure.

According to embodiments, the electrostatic capacitance switch has high-speed responsiveness and is capable of stable two-stage input in one stroke.

What is claimed is:
1. A capacitance switch comprising:
   an electrode portion including a first electrode and a second electrode electrically insulated from the first electrode;
   a moving member formed of an electric conductor or a dielectric; and a pressing member having a projecting portion, wherein the pressing member is configured to change a distance between the moving member and the electrode portion by displacing the projecting portion in a first direction, wherein the moving member has a first moving surface and a second moving surface that moves independently of the first moving surface, wherein the projecting portion includes:

a central projecting portion that is to be displaced by first pressing of the pressing member and brings the first moving surface close to the electrode portion; and a peripheral projecting portion that is to be displaced by second pressing larger than the first pressing and brings the second moving surface close to the electrode portion, and wherein the central projecting portion projects in the first direction with respect to the peripheral projecting portion.

2. The capacitance switch according to claim 1, wherein the moving member has a planar shape, and wherein the moving member includes:

a first spring portion that moves the first moving surface toward the electrode portion by urging the first moving surface due to displacement of the central projecting portion; and a second spring portion that moves the second moving surface toward the electrode portion by urging the second moving surface due to displacement of the peripheral projecting portion.

3. The capacitance switch according to claim 2, wherein the first spring portion includes a first spiral spring, and wherein the second spring portion includes a second spiral spring.

4. The capacitance switch according to claim 2, wherein the pressing member includes a deformation member that has flexibility and is deformable, wherein the central projecting portion is provided at a center of the pressing member in a plan view of the pressing member, wherein the central projecting portion is separated from the moving member at a normal time when the pressing member is not pressed, wherein the central projecting portion is in contact with the first moving surface by a deformation of the deformation member at the time of the first pressing, wherein the peripheral projecting portion is provided at a position away from the first projecting portion in the plan view, wherein the peripheral projecting portion is separated from the moving member at the normal time, and wherein the peripheral projecting portion is in contact with the second moving surface by a deformation of the deformation member at the time of the second pressing.

5. The capacitance switch according to claim 4, wherein the peripheral projecting portion includes two sections, wherein the two sections of the peripheral projecting portion oppose to each other in the plan view, and wherein the central projecting portion is disposed between the two sections of the peripheral projecting portion in the plan view.

* * * * *